(12) United States Patent
Nickel et al.

(10) Patent No.: US 7,078,244 B2
(45) Date of Patent: Jul. 18, 2006

(54) MULTI-BIT MRAM DEVICE WITH SWITCHING NUCLEATION SITES

(75) Inventors: Janice H. Nickel, Sunnyvale, CA (US); Manoj K. Bhattacharyya, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/112,815

(22) Filed: Apr. 21, 2005

(65) Prior Publication Data

US 2005/0195649 A1    Sep. 8, 2005

Related U.S. Application Data

(60) Division of application No. 10/449,261, filed on May 30, 2003, now Pat. No. 6,927,995, which is a continuation-in-part of application No. 10/173,195, filed on Jun. 17, 2002, now Pat. No. 6,803,616, and a continuation-in-part of application No. 09/925,755, filed on Aug. 9, 2001, now Pat. No. 6,911,710.

(51) Int. Cl.
*H01L 21/00*    (2006.01)

(52) U.S. Cl. ............................................. 438/3; 438/48
(58) Field of Classification Search .................... 438/3, 438/48, 104, 179, 286
See application file for complete search history.

(56) References Cited

U.S. PATENT DOCUMENTS

| | | | |
|---|---|---|---|
| 5,640,343 A | | 6/1997 | Gallagher et al. |
| 5,930,164 A | * | 7/1999 | Zhu ........................... 365/158 |
| 6,104,633 A | * | 8/2000 | Abraham et al. ........... 365/171 |
| 6,166,948 A | * | 12/2000 | Parkin et al. ................ 365/173 |
| 6,611,405 B1 | * | 8/2003 | Inomata et al. ........... 360/324.2 |

OTHER PUBLICATIONS

J.M. Slaughter, et al, Magnetic Tunnel Junction Materials for Electronic Applications, JOM, JOM-3, 52 (6) 2000, http://www.tms.org/pubs/journals/JOM/0006/Slaughter/Slaughter-0006.html. Jun. 2000.

Caroline A. Ross, et al., Making Nanoscale Magnetic Elements for Magnetic Random Access Memories, NSF Partnership in Nanotechnology Conference, Jan. 29&30, 2001.

* cited by examiner

*Primary Examiner*—B. William Baumeister
*Assistant Examiner*—Igwe U. Anya (57) ABSTRACT

A magnetic memory cell includes a first magneto-resistive device and a second magneto-resistive device. The first magneto-resistive device has a first sense layer. The second magneto-resistive device is connected in series with the first magneto-resistive device. The second magneto-resistive device has a second sense layer. At least one controlled nucleation site is placed on at least one of the first sense layer and the second sense layer.

4 Claims, 6 Drawing Sheets

FIGURE 6

MULTI-BIT MRAM DEVICE WITH SWITCHING NUCLEATION SITES

CROSS REFERENCE TO RELATED APPLICATIONS

This application is a division of Ser. No. 10/449,261, filed May 30, 2003 now U.S. Pat. No. 6,927,995, which is a continuation-in-part of U.S. patent application Ser. No. 09/925,755 filed Aug. 9, 2001 now U.S. Pat. No. 6,911,710 and U.S. patent application Ser. No. 10/173,195 filed Jun. 17, 2002 now U.S. Pat. No. 6,803,616.

BACKGROUND

A magnetic random access memory (MRAM) is a solid-state non-volatile magnetic storage device. Bits of data are stored in small magneto-resistive elements. For example, in a magnetic tunnel junction (MTJ) magneto-resistive element, two ferromagnetic layers, a pinned magnetic layer and a sense magnetic layer, are separated by an insulating tunnel barrier. Magneto-resistance results from the spin-polarized tunneling of conduction electrons between the ferromagnetic layers. The tunneling current depends on the relative orientation of the magnetic moments of the two ferromagnetic layers.

The magnetization direction of the sense layer is used for information storage. The resistance is either low or high, depending on the relative magnetization direction of the sense magnetic layer with respect to that of the pinned magnetic layer. The magnetization directions are either parallel (P) or antiparallel (AP).

In conventional MRAM arrays, orthogonal lines pass under and over the magneto-resistive elements, carrying current that produces magnetic fields used to switch the individual elements in the MRAM array. The magneto-resistive elements are designed so that magnetization direction of the sense magnetic layer will not switch when current is applied to just one line, but will switch when current is applied to both lines. In practice, however, large switching distributions of the magnetic tunnel junctions in an MRAM array can result in errors. That is, some half-selected magnetic tunnel junctions switch in the presence of only a single applied current, and some selected magnetic tunnel junctions do not switch in the presence of two orthogonal applied currents.

It is a continuing goal to increase MRAM storage density. Increasing the storage density increases the amount of information that can be stored per unit area. However, increasing the storage density also can result in increased potential for errors.

SUMMARY OF THE INVENTION

In accordance with the preferred embodiment of the present invention, a magnetic memory cell is presented. The magnetic memory cell includes a first magneto-resistive device and a second magneto-resistive device. The first magneto-resistive device has a first sense layer. The second magneto-resistive device is connected in series with the first magneto-resistive device. The second magneto-resistive device has a second sense layer. At least one controlled nucleation site is placed on at least one of the first sense layer and the second sense layer.

DESCRIPTION OF THE PREFERRED EMBODIMENT

Figure 1:
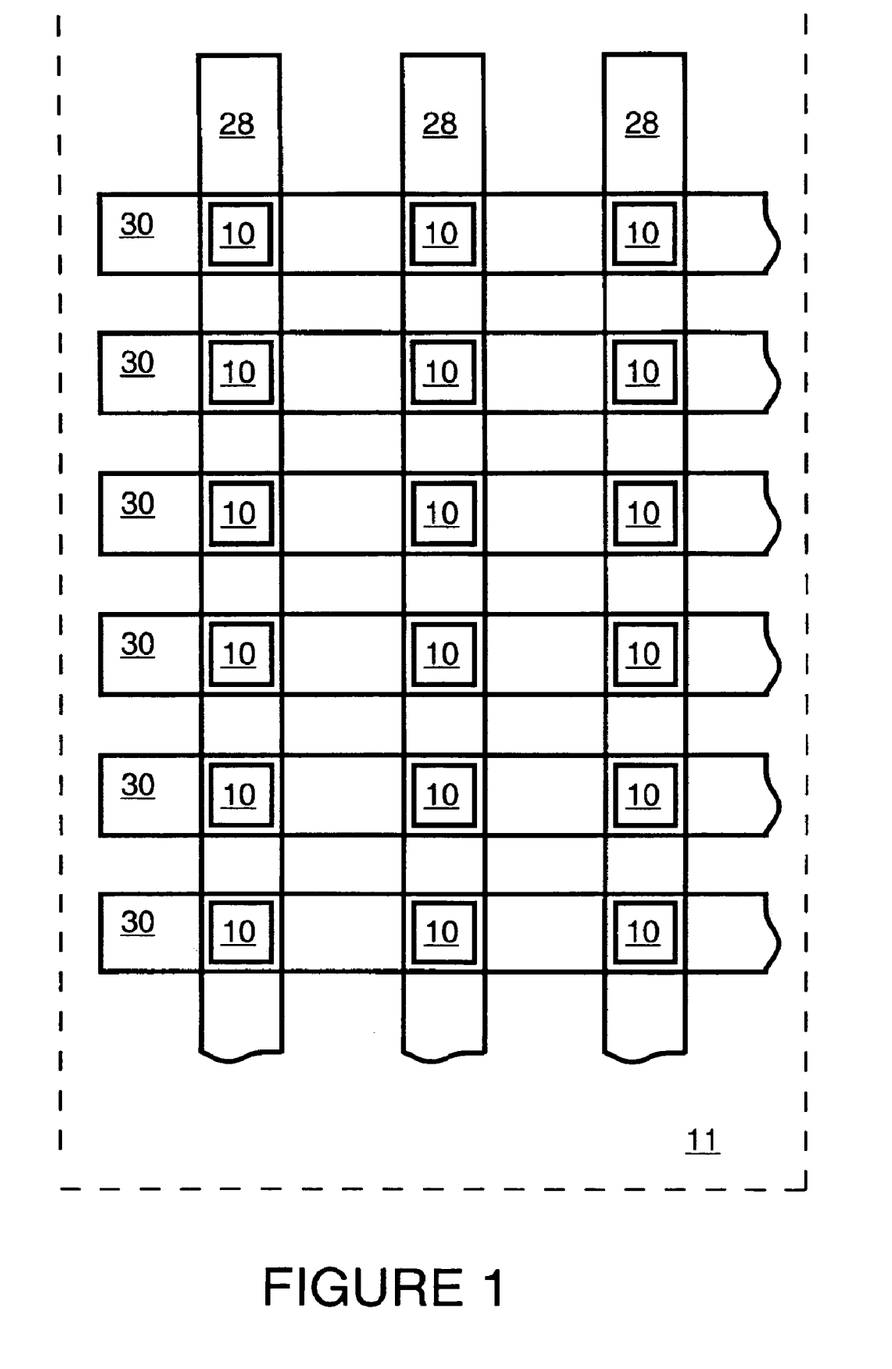
FIG. 1 is an illustration of an MRAM device that has an array of multi-bit memory cells.

An MRAM device 11 consists of a resistive cross point array of multi-bit memory cells 10. Memory cells 10 are arranged in rows and columns. Only a relatively small number of the memory cells 10 are shown to simplify the illustration of the MRAM device 11. In practice, arrays of any size may be used.

Horizontal traces 30 function as word lines. Vertical traces 28 function as bit lines. For example, there is one word line for each row of the array and one bit line for each column of the array. Each memory cell 10 is located at a cross point of a word line and a bit line. MRAM device 11 includes a read/write circuit (not shown) for sensing the resistance states of selected memory cells during read operations and for supplying write currents to selected word and bit lines during write operations.

Each memory cell 10 is implemented as a multi-bit memory cell. That is, each memory cell 10 includes two magneto-resistive devices connected in series. Each of the two magneto-resistive devices have sense layers with distinctly different coercivities and, therefore, requiring different writing currents. Thus write operations can be performed selectively on the two magneto-resistive devices. Each multi-bit memory cell has four logic states with different resistance values in each state. This allows for storage of more data than a conventional single-bit memory cell, which has only two logic states.

Figure 2:
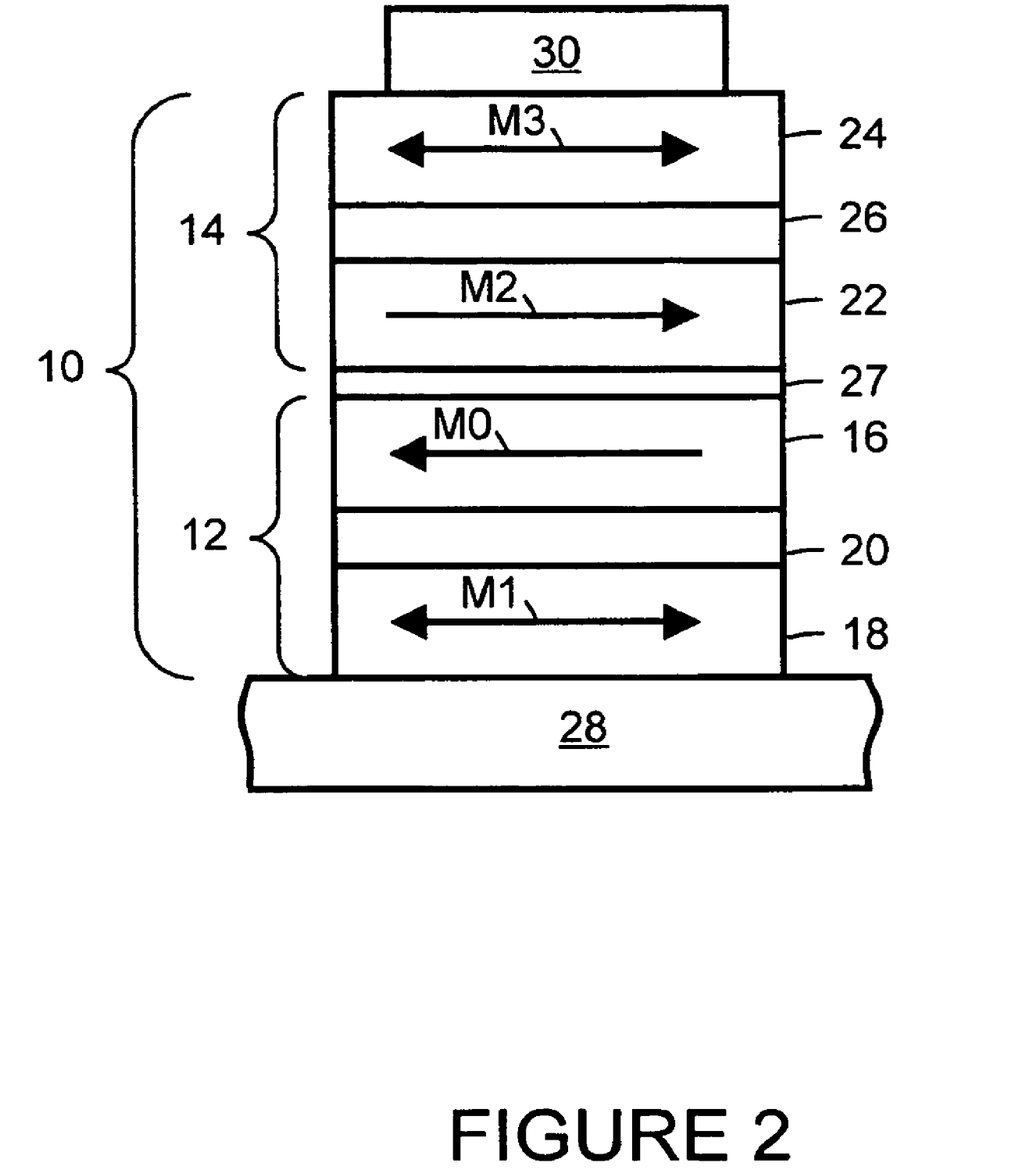
FIG. 2 shows a multi-bit memory cell structure in accordance with a preferred embodiment of the present invention.

FIG. 2 is an exemplary structure for each memory cell 10. Each memory cell 10 includes a magnetic tunnel junction 12 and a magnetic tunnel junction 14 connected in series. Magneto-resistive device 12 includes a first pinned layer 16, a first sense ferromagnetic (FM) layer 18, and a first insulating tunnel barrier 20. First pinned layer 16 has a magnetization vector M0 that is oriented in the plane of the first pinned layer 16. Magnetization vector M0 of first pinned layer 16 is held in one direction, even in the presence of an applied magnetic field in a first range of interest. First pinned layer 16 is, for example, a single layer hard magnet or a synthetic antiferromagnet. Alternatively, first pinned layer 16 can be a multi-layer exchange magnet containing, for example, at least one ferromagnetic layer coupled to an anti-ferromagnetic exchange layer.

First sense layer 18 has a magnetization vector M1 that is not pinned. Instead, first sense layer magnetization vector M1 can be oriented in either of two directions in the presence of an applied magnetic field in the first range of interest. The magnetization orientation of first magneto-resistive device 12 is parallel when the sense layer magnetization vector M1 is oriented in the same direction as the pinned layer magnetization vector M0, and it is antiparallel when the sense layer magnetization vector M1 is oriented in the opposite direction of the pinned layer magnetization vector M0. A sense layer is also referred to herein as a data layer.

First insulating tunnel barrier 20 allows quantum mechanical tunneling to occur between the first pinned layer 16 and first sense layer 18. This tunneling phenomenon is electron spin dependent, making the resistance of the first magneto-resistive device 12 a function of the relative orientations of magnetization vector M0 and magnetization vector M1. For example, resistance of the first magneto-resistive device 12 is a first value (R1) if its magnetization orientation is parallel and a second value (R1+ΔR1) if its magnetization orientation is anti-parallel.

Second magneto-resistive device 14 includes a second pinned layer 22, a second sense FM layer 24, and a second insulating tunnel barrier 26 between second pinned layer 22 and sense layer 24. Second pinned layer 22 has a magnetization vector M2 that is oriented in the plane of second pinned layer 22 and is held in one direction, even in the presence of an applied magnetic field in a second range of interest. Second pinned layer 22 is, for example, a single-layer hard magnet, a multilayer exchange magnet, or a synthetic antiferromagnet.

Second sense layer 24 has a magnetization vector M3 that is oriented in either of two directions in the presence of an applied magnetic field in the second range of interest. Resistance of the second magneto-resistive device 14 is a third value (R2) if its magnetization orientation is parallel and a fourth value (R2+ΔR2) if its magnetization orientation is anti-parallel.

A non-magnetic conductive separation layer 27 is located between first junction 12 and second junction 14. Separation layer 27 has a thickness that prevents magnetic coupling between first junction 12 and second junction 14, yet the separation layer 27 allows first junction 12 and second junction 14 to be electrically connected. Separation layer 27 is made of, for example, a material such as copper, tantalum, gold or ruthenium. When composed of tantalum, separation layer 27 may also function as a seed layer for second pinned layer 22 when second pinned layer contains an anti-ferromagnetic pinning layer, for example, a compound such as IrMn.

In this embodiment, the order of deposition of the sense and pinned layers for each of the first and second memory elements can be reversed; for example, the first pinned layer may be deposited first, followed by a first tunnel barrier and then the first sense layer. Similarly the order may be reversed in the second memory element.

First sense layer 18 and second sense layer 24 have different coercivities, resulting in first magneto-resistive device 12 and second magneto-resistive device 14 having different coercivities. For example, first magneto-resistive device 12 has a greater coercivity than second magneto-resistive device 14 (i.e., Hc1>Hc2). Therefore, the first range of interest is larger than the second range of interest, and a larger magnetic field is needed to change the orientation of first sense layer magnetization vector M1 than the orientation of second sense layer magnetization vector M3. Additionally, magneto-resistive device 12 and magneto-resistive device 14 have resistances that allow the four different logic states to be distinguished.

Write currents are supplied to vertical traces 28 and horizontal traces 30 to create magnetic fields. The magnetic fields are used to write to magneto-resistive devices 12 and 14. That is, the magnetic fields are used to set the orientations of sense layer magnetization vectors M1 and M3. Magnitudes of the write currents determine the magnetic field strength, and direction of the write currents determine the direction in which a sense layer magnetization vector is switched.

A logic value may be written to first magneto-resistive device 12 by supplying write currents of appropriate magnitude and direction to one of vertical traces 28 and one of horizontal traces 30 that intersect at first magneto-resistive device 12. The resulting magnetic field, which is within the first range of interest, sets the first sense layer magnetization vector M1 in the desired direction. Since the first magneto-resistive device 12 has a higher coercivity than that of second magneto-resistive device 14, the resulting magnetic field also sets second sense layer magnetization vector M3 in the same direction as first sense layer magnetization vector M1. When first magneto-resistive device 12 is written, second magneto-resistive device 14 gets reset. Thus, second magneto-resistive device 14 is read before writing first magneto-resistive device 12. After writing first magneto-resistive device 12, second magneto-resistive device 14 may have to be rewritten.

A logic value may be written only to second magneto-resistive device 14 by supplying write currents of appropriate magnitude and direction to vertical traces 28 and horizontal traces 30. The resulting magnetic field, which is within the second range of interest, sets second sense layer magnetization vector M3 in the desired direction. Since second magneto-resistive device 12 has a lower coercivity than that of the first magneto-resistive device 14, the resulting magnetic field does not change the orientation of first sense layer magnetization vector M1.

The logic state of each memory cell 10 can be read by applying a voltage across the memory cell, and determining the magnitude of a sense current that flows through the memory cell. Magnitude of the sense current is proportional to the total resistance of the series-connected junctions 12 and 14.

Table 1 below provides an example for the resistance states for the different orientations of the sense layer magnetization vectors M1 and M3 (for M0=−> and M2=<−).

TABLE 1

| M1 | M3 | Junction Resistance |
|---|---|---|
| —> | —> | R1 + R2 + ΔR2 |
| —> | <— | R1 + R2 |
| <— | —> | R1 + ΔR1 + R2 + ΔR2 |
| <— | <— | R1 + ΔR1 + R2 |

If first and second magneto-resistive devices 12 and 14 have the same delta resistance (that is, ΔR1=ΔR2), the resistance state R1+R2+ΔR2 is indistinguishable from the resistance state R1+ΔR1+R2. If the difference in delta resistances is distinguishable, then the memory cell has four distinguishable logic states. The delta resistances may be made different, for example, by making first insulating tunnel barrier 20 and second insulating tunnel barrier 26 of different thicknesses, or by making first sense layer 18 and second sense layer 24 of different materials having different polarization.

There are a number of different ways of making magneto-resistive devices 12 and 14 have different coercivities. For instance, first sense layer 18 and second sense layer 24 may have different shapes or sizes, they may have different thicknesses, or they may be made of different materials.

Typical sense layer materials include, but are not limited to NiFe, NiFeCo and CoFe. If the first sense layer 18 is made of NiFeCo or CoFe and second sense layer 24 is made of NiFe, the first sense layer 18 has a higher coercivity than second sense layer 24. In general, increasing the percentage of cobalt will increase coercivity.

One way to make the switching currents more predictable is to add nucleation sites to first sense layer 18 and second sense layer 24. Nucleation sites are regions within each sense layer where the reversal of magnetization is initiated.

Nucleation sites are created, for example, by irregularities in the shape of the sense layer. This is accomplished, for example, by controlled edge roughness. This roughness takes the form, for example, of one or more protrusions and/or divots at one or more sites along the edge of the sense layer. The shape of the divots or protrusions may be circular, elliptical, rectangular, or any other shape.

The nucleation sites are controlled in that a first set of nucleation sites have the same form and relative locations in first sense layer 18 for all memory cells in MRAM device 11, and a second set of nucleation sites have the same form and relative locations in second sense layer 24 for all memory cells in MRAM device 11. For example, nucleation sites locations are along edges and/or near corners in the sense layers.

Nucleation, the initiation of switching reversal, occurs at the nucleation sites, even if neighboring region contains defects. When the nucleation sites are formed along the edges on the sense layers, the randomness of nucleation is reduced. Consequently, switching distribution (the distribution of coercivities) of the memory cells 10 in the MRAM device 11 is more uniform.

Size of the nucleation sites may be between 0.25 W and 0.75 W, where W is the width of the sense layer. However, the size of the nucleation sites is not limited. The size of the nucleation sites may be much smaller than W, for example, in the range of 0.05 W to 0.1 W.

For example, the nucleation sites are as thick as the sense layers, at a minimum. Thus, the protrusions are at least as thick as the sense layer the protrusion is a part of, and the divots extend through the sense layer the divot is a part of.

Figure 3:
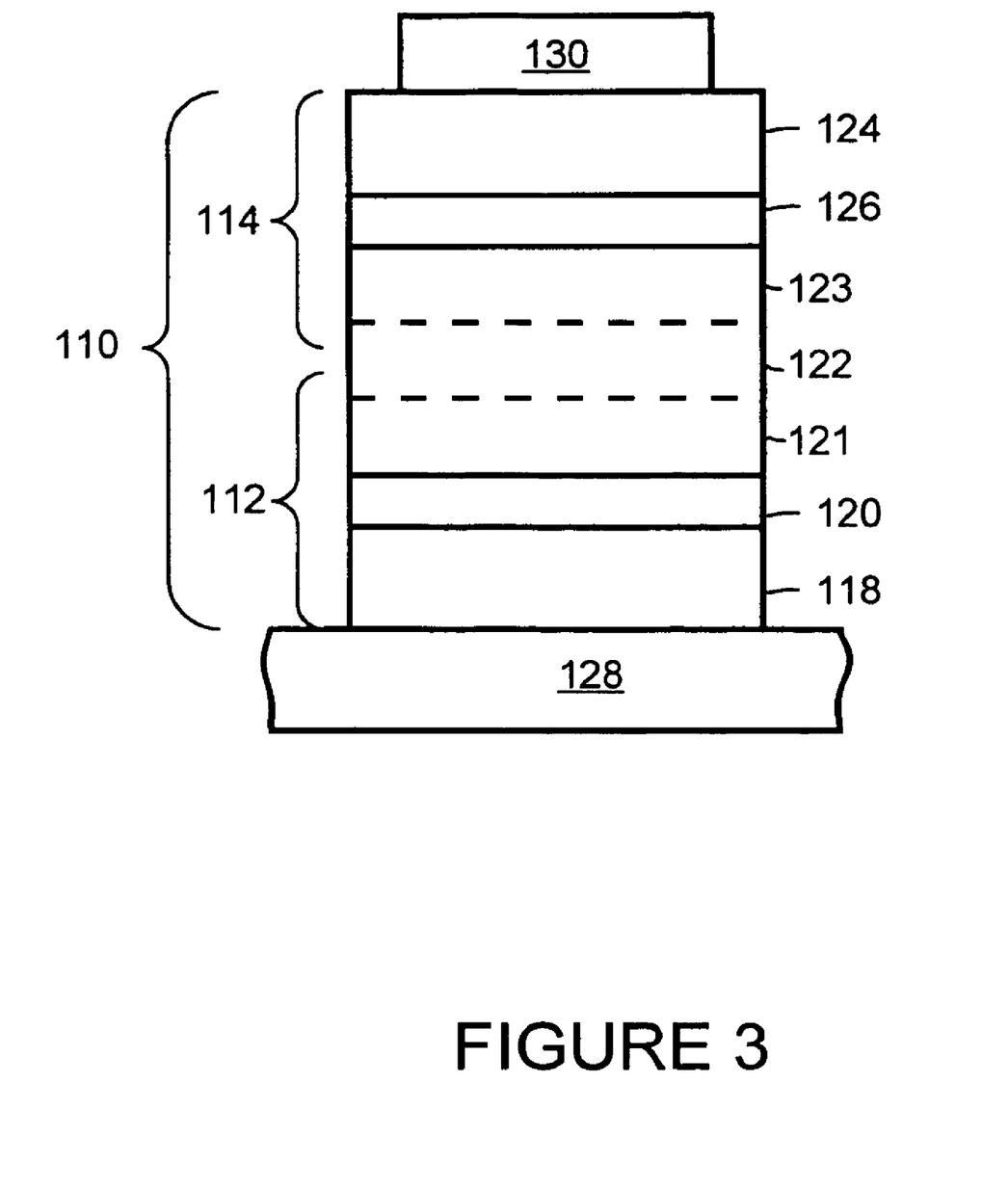
FIG. 3 shows a multi-bit memory cell structure in accordance with another preferred embodiment of the present invention.

FIG. 3 is another exemplary structure for each memory cell 10. A magnetic tunnel junction 112 and a magnetic tunnel junction 114 are connected in series. Magneto-resistive device 112 includes a first sense ferromagnetic (FM) layer 118, and a first insulating tunnel barrier 120. Second magneto-resistive device 114 includes a second sense FM layer 124, and a second insulating tunnel barrier 126 between second pinned layer 123 and sense layer 124.

Magnetic tunnel junction 112 and magnetic tunnel junction 114 share a single antiferromagnetic layer 122. Antiferromagnetic layer 122 is surrounded by a first ferromagnetic layer 121 and a second ferromagnetic layer 123. Alternatively, a shared pinned layer can consist of a hard ferromagnet or a synthetic antiferromagnet.

Figure 4:
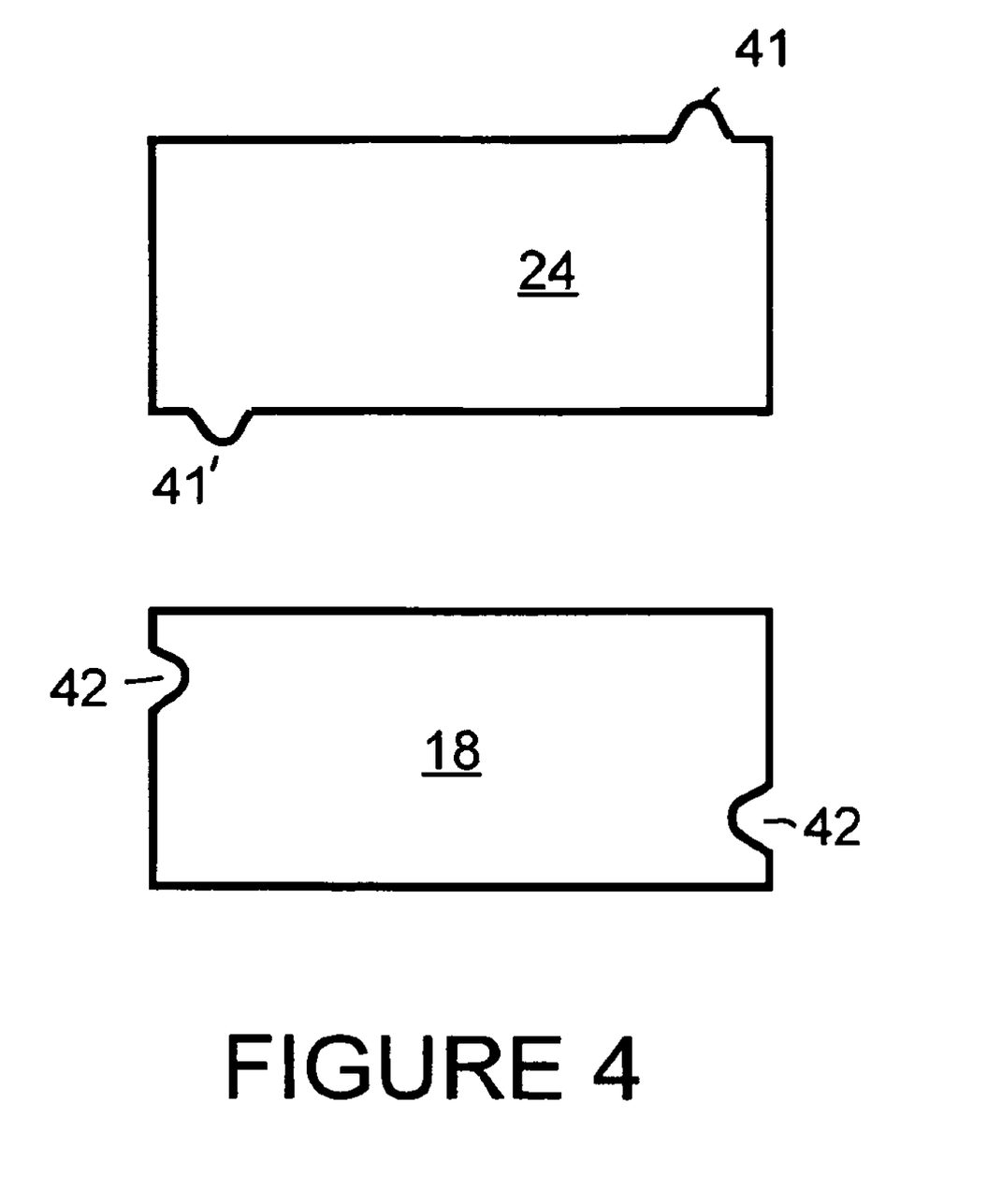
FIG. 4 and FIG. 5 illustrate different layers within a multi-bit memory cell having different types and/or numbers of controlled nucleation sites in accordance with a preferred embodiment of the present invention.
Figure 5:
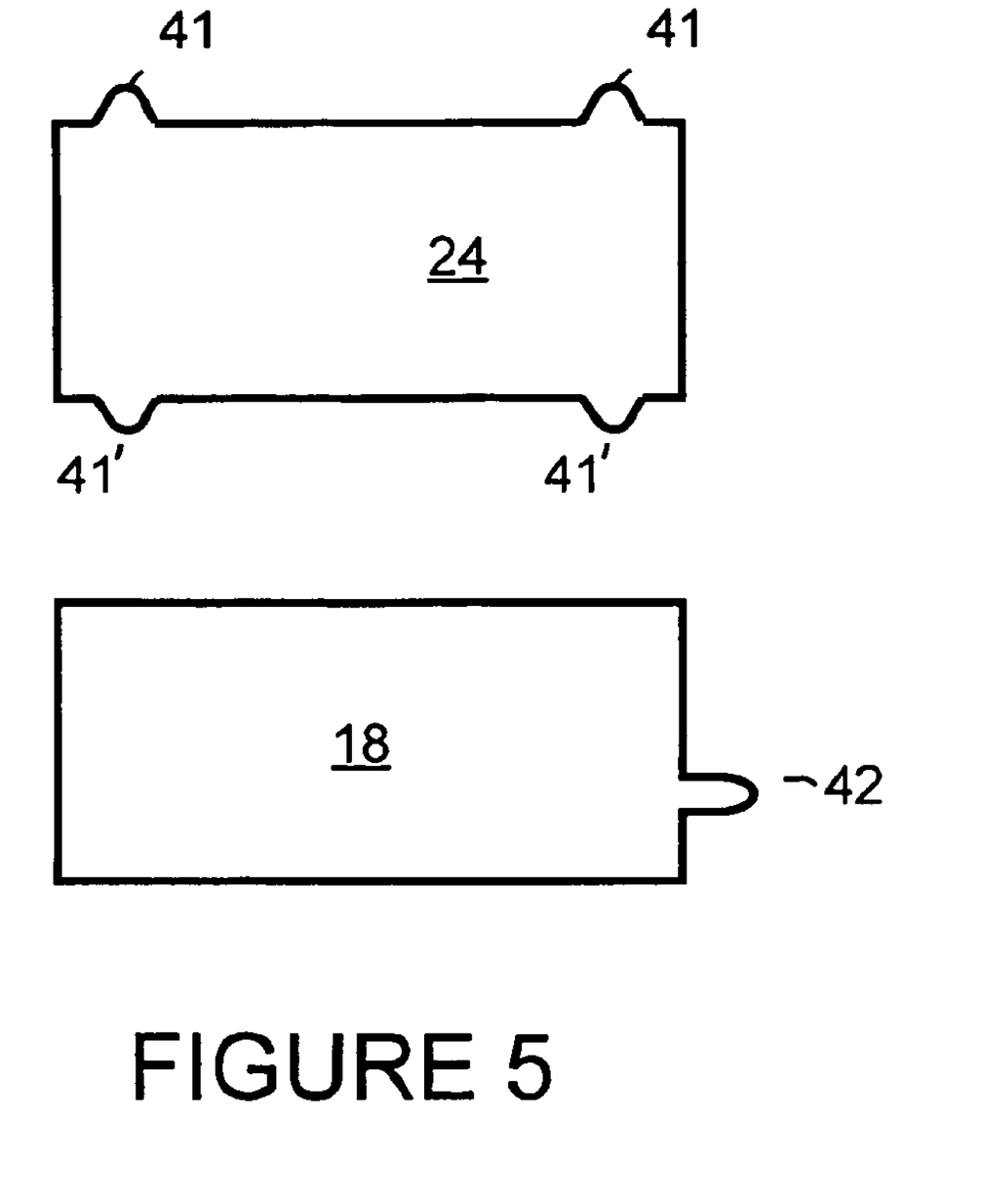

FIG. 4 shows example nucleation sites 42 on first sense layer 18 as contrasted with nucleation sites 41 on second sense layer 24. The size number and form of nucleation sites can vary as necessary to provide the switching distribution. For example, FIG. 5 shows another example of nucleation sites 42 on first sense layer 18 as contrasted with nucleation sites 41 on second sense layer 24. As will be understood by persons of ordinary skill in the art, FIG. 4 and FIG. 5 are illustrative of an infinite number of ways nucleation sites 42 on first sense layer 18 can vary in size, number and form from nucleation sites 41 on second sense layer 24. The nucleation sites within each layer may be in a non-symmetric arrangement, for example, to compensate for an offset in switching fields. For example, one site might nucleate at a higher switching field for one direction, and a lower switching for the other direction. This asymmetry of nucleation may be used to cancel the switching asymmetry caused by residual magnetostatic field, if any, coming out of the pinned layers.

Figure 6:
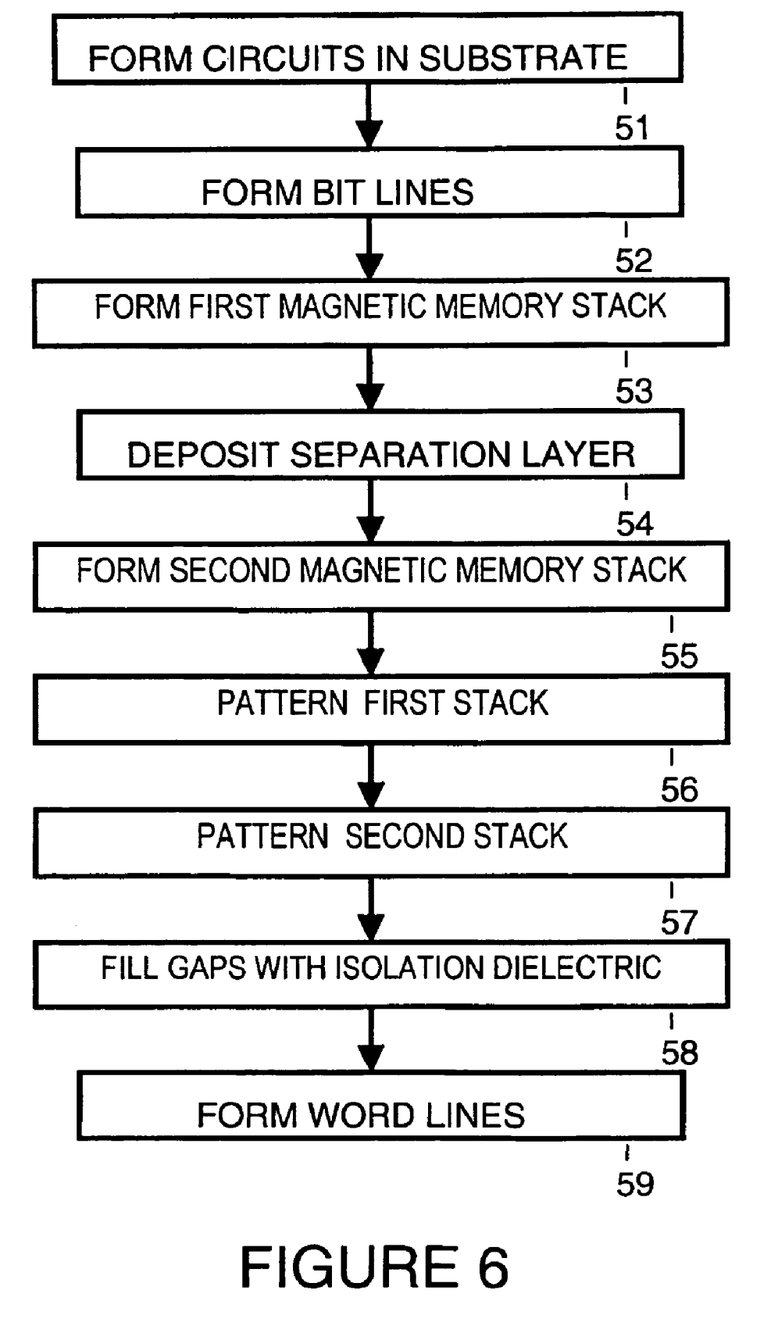
FIG. 6 illustrates a method of manufacturing a multi-bit memory cell in accordance with a preferred embodiment of the present invention.

FIG. 6 illustrates the fabrication of an MRAM device including an array of multi-bit cell memory cells having magneto-resistive devices. In a processing step 51, the read/write circuit and other circuits are formed in a silicon substrate. In a processing step 52, bit lines are formed on the substrate. In a processing step 53, a first stack of magnetic memory element material is deposited. A stack for magnetic tunnel junctions may include pinned ferromagnetic layer material, insulating tunnel barrier material, and sense (data) layer material. The sense (data) layer material may be deposited before or after the pinned layer material.

According to a first embodiment (illustrated in FIG. 2), in a processing step 54, a separation layer is formed over the first stack of magnetic memory element material. In a processing step 55, a second stack of magnetic memory element material is deposited. In a second embodiment (illustrated in FIG. 3), both memory element stacks share the same pinning layer for the pinned ferromagnet.

In a processing step 56, patterning is performed down through the first stack of magnetic memory element material, for example, using photolithography or electron beam lithography. The patterns include the definitions of the nucleation sites (e.g., protrusions, divots) in the first stack. A hard mask may be used during bit formation to define the bits (including the nucleation sites). An advantage of the hard mask is that it reduces edge roughness and allows the bits to be formed closer together. A nucleation site will be formed on each pinned layer, as well as each sense (data) layer.

In a processing step 57, patterning is performed again but just through the second stack of magnetic memory element, for example, using photolithography, or electron beam lithography. Depending on implementation, the patterns may or may not include the definitions of the nucleation sites (e.g., protrusions, divots) in the first stack. A hard mask may be used during bit formation to define the bits (including the nucleation sites).

In a processing step 58, gaps created by the patterning are filled in with an isolation dielectric. In a processing step 59, bit lines are deposited. Additional levels may be added to the MRAM device. An insulation material such as silicon dioxide is deposited on the last level.

The MRAM device may be used in a variety of applications. For example, the MRAM device may be used for long term data storage in devices such as solid state hard drives and digital cameras. It may be used for embedded applications such as extremely fast processors and network appliances.

In an alternative embodiment, the first stack can be patterned before deposition of the separation layer. In this case, to perform the patterning, the silicon substrate is removed from the deposition chamber, typically requiring breaking vacuum. However, when vacuum is broken between layer depositions, this can degrade the quality of subsequent layers due to the incorporation of defects and impurities.

Once returned to the deposition chamber, an ion etch may be performed on the top layer of the first stack to remove defects and impurities. The ion etch process also smoothes the surface of the top layer with the result that the remaining portion is in a pristine condition, ready for deposition of the remaining materials stack. This embodiment has the disadvantage of requiring an isolation dielectric after patterning the first stack and before depositing the second stack.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure is intended to be illustrative, but not limiting, of the scope of the invention, which is set forth in the following claims.

We claim:

1. A method for producing a magnetic memory cell comprising the following:

forming a first magneto-resistive device having a first sense layer, including:

placing at least one controlled nucleation site on the first sense layer; and, forming a second magneto-resistive device connected in series with the first magneto-resistive device, the second magneto-resistive device having a second sense layer, including:

placing at least one controlled nucleation site on the second sense layer.

2. A method as in claim 1 wherein nucleation sites on the first sense layer are different in shape relative to nucleation sites on the second sense layer.

3. A method as in claim 1 wherein nucleation sites on the first sense layer are different in size relative to nucleation sites on the second sense layer.

4. A method as in claim 1 wherein nucleation sites on the first sense layer are different in placement relative to nucleation sites on the second sense layer.

* * * * *